United States Patent [19]
Lee et al.

[11] Patent Number: 6,025,621
[45] Date of Patent: Feb. 15, 2000

[54] INTEGRATED CIRCUIT MEMORY DEVICES HAVING INDEPENDENTLY BIASED SUB-WELL REGIONS THEREIN AND METHODS OF FORMING SAME

[75] Inventors: Kyu-chan Lee, Seoul; Keum-yong Kim, Kyungki-do, both of Rep. of Korea

[73] Assignee: Samsung Electronics Co., Ltd., Rep. of Korea

[21] Appl. No.: 09/179,556

[22] Filed: Oct. 27, 1998

[30] Foreign Application Priority Data

Dec. 27, 1997 [KR] Rep. of Korea ............. 97-74972

[51] Int. Cl.[7] .................. H01L 27/108; H01L 29/76; H01L 29/94; H01L 31/119
[52] U.S. Cl. ............. 257/296; 257/299; 257/371; 257/901
[58] Field of Search ................. 257/901, 299, 257/371, 296

[56] References Cited

U.S. PATENT DOCUMENTS

| Re. 35,613 | 9/1997 | Yasuda et al. | 257/371 |
|---|---|---|---|
| 5,373,476 | 12/1994 | Jeon | 365/226 |
| 5,386,135 | 1/1995 | Nakazato et al. | 257/369 |
| 5,519,243 | 5/1996 | Kikuda et al. | 287/371 |
| 5,595,925 | 1/1997 | Chen et al. | 437/52 |
| 5,786,617 | 7/1998 | Merrill et al. | 257/371 |
| 5,894,145 | 4/1999 | Chen et al. | 257/296 |

FOREIGN PATENT DOCUMENTS 94-3026 2/1994 Rep. of Korea.

*Primary Examiner*—William Mintel
*Attorney, Agent, or Firm*—Myers Bigel Sibley & Sajovec

[57] ABSTRACT

Integrated circuit memory devices include a semiconductor substrate of first conductivity type (e.g., P-type), a first well region of second conductivity type (e.g., N-type) in the substrate and first and second nonoverlapping sub-well regions of first conductivity type in the first well region. To improve the electrical characteristics of circuits within the memory device, a first semiconductor device is provided in the first sub-well region (which is biased at a back-bias potential (Vbb)) and a second semiconductor device is provided in the second sub-well region (which is biased at a ground or negative supply potential (Vss)). The first semiconductor device is preferably selected from the group consisting of memory cell access transistors, equalization circuits and isolation gates. The second semiconductor device is also preferably selected from the group consisting of column select circuits and sense amplifiers.

8 Claims, 4 Drawing Sheets

6,025,621

INTEGRATED CIRCUIT MEMORY DEVICES HAVING INDEPENDENTLY BIASED SUB-WELL REGIONS THEREIN AND METHODS OF FORMING SAME

FIELD OF THE INVENTION

The present invention relates to integrated circuit devices, and more particularly to integrated circuit memory devices and methods of forming integrated circuit memory devices.

BACKGROUND OF THE INVENTION

Integrated circuit devices such as dynamic random access memory (DRAM) devices typically utilize well region biasing techniques to improve electrical characteristics of devices therein by increasing latch-up immunity, increasing cell isolation and increasing operating speed. Unfortunately, such biasing techniques may lead to an increase in short channel effects which can degrade device performance. Techniques to improve the electrical characteristics of discrete devices within a DRAM device are disclosed in Korean Laid-open Patent Publication No. 94-003026 and in U.S. Pat. No. 5,595,925 to Chen et al. The Korean Laid-open Patent Publication No. 94-003026 discloses a semiconductor memory device comprising a substrate of first conductivity type (e.g., P-type), a first well region of second conductivity (to which a first bias (Vint) is applied) in the substrate and a second well region of first conductivity (to which a second bias (Vss/Vbb) is applied) in the first well region. A third well region of second conductivity (to which the second bias Vss/Vbb is applied) is also provided in the substrate, at a location adjacent the first well region. The '925 patent to Chen et al. also discloses a DRAM device having three separate regions: an input/output section 12, a peripheral transistor section 14 and a memory array section 16 all formed on a P-type substrate layer 18. The DRAM device of the '925 patent can employ separate substrate bias voltages for each section. The input/output section 12 has a P-type region 22 that is isolated from the P-type substrate layer 18 by an N-type well region 20. The peripheral transistor section 14 also has a P-type region 36 that can be isolated from the P-type substrate layer 18 by an optional N-type well region 40 for those devices which require a different substrate bias voltage between the peripheral transistor section 14 and the memory array section 16.

Referring now to FIG. 1, a cross-sectional view of a triple-well integrated circuit memory device according to the prior art is illustrated. In particular, this memory device comprises a first N-type well region 104 formed in a memory array region 140 of a P-type substrate 102, a first P-type sub-well region 106 formed in the first N-type well region 104, first N-type source and drain regions 108 which are formed in the first P-type sub-well region 106, a first gate electrode 110 extending opposite the first P-type sub-well region 106, and a first P-type contact region 112 in the first P-type sub-well region 106. The first P-type contact region 112 is electrically connected to a back bias terminal Vbb. The first N-type well region 104 also includes P-type source and drain regions 114 and an N-type contact region 118 which is coupled to a positive power supply terminal Vcc. A second gate electrode 116 is also provided opposite the first N-type well region 104. In the peripheral circuit region 146, an NMOS region 142 and a PMOS region 144 are provided. The NMOS region 142 includes a second P-type well region 120 in the P-type substrate 102. N-type source and drain regions 122 are also provided in the second P-type well region 120 along with a P-type contact region 126 which is electrically connected to a ground reference terminal Vss. An insulated gate electrode 124 is also provided opposite the second P-type well region 120. The PMOS region 144 includes a second N-type well region 128, and P-type source and drain regions 130 in the second N-type well region 128. An insulated gate electrode 132 is also provided on the substrate 102, opposite the second N-type well region 128. An N-type contact region 134 is also provided in the second N-type well region 128 and is electrically connected to a power supply terminal Vcc. A P-type contact region 136 is also provided in the P-type substrate 102 and is electrically connected to the ground reference terminal Vss.

Referring now to FIG. 2, an electrical schematic of an integrated circuit memory device according to the prior art is provided. This memory device includes first and second memory cell regions 202 and 218, first and second equalization circuits 204 and 216, first and second isolation gates 206 and 214, first and second sense amplifiers 208 and 212 and a column select circuit 210 which is electrically coupled to complementary data lines IO and IOB. Peripheral circuits 220 are also provided in a second P-type well region and a second N-type well region which are electrically coupled to the ground terminal Vss and the power supply terminal Vcc, respectively. As illustrated, left and right word lines WLL and WLR, left and right equalization control signal lines PEQL and PEQR, left and right isolation control signal lines PISOL and PISOR, complementary amplifier control signal lines LA and LAB and a column select signal line CSL are provided to the memory device. Furthermore, with respect to FIG. 1, the memory cells 202 and 218, the equalization circuits 204 and 216, the isolation gates 206 and 214, the second sense amplifier 212 and the column select circuit 210 contain NMOS transistors which are all formed in the first P-type sub-well region 106. This P-type sub-well region 106 is electrically coupled to the back bias terminal Vbb. On the other hand, the first sense amplifier, which comprises PMOS transistors, is formed in the first N-type well region 104 which is electrically coupled to the power supply terminal Vcc.

Notwithstanding these memory devices which contain multiple well regions and sub-well regions which inhibit short channel effects, increases in integration density may lead to an undesirable increase in parasitic body effects. To inhibit such body effects, a ground voltage can be used as a substrate voltage in the peripheral circuit region instead of a negative voltage bias. However, such techniques to reduce body effects may not lead to an improvement in noise immunity.

SUMMARY OF THE INVENTION

It is therefore an object of the present invention to provide improved integrated circuit memory devices and methods of forming same.

It is another object of the present invention to provide integrated circuit memory devices which have reduced susceptibility to parasitics such as short-channel effects, latch-up and noise and methods of forming same.

These and other objects, advantages and features of the present invention are provided by integrated circuit memory devices which comprise a semiconductor substrate of first conductivity type (e.g., P-type), a first well region of second conductivity type (e.g., N-type) in the substrate (and forming a rectifying junction with the substrate) and first and second nonoverlapping sub-well regions of first conductivity type in the first well region. In addition, to improve the electrical characteristics of circuits within the memory device by reducing parasitics, a first semiconductor device is provided in the first sub-well region (which is biased at a back-bias potential (Vbb)) and a second semiconductor device is provided in the second sub-well region (which is biased at a ground or negative supply potential (Vss)). The first semiconductor device is preferably selected from the group consisting of memory cell access transistors, equalization circuits and isolation gates. The second semiconductor device is also preferably selected from the group consisting of column select circuits and sense amplifiers. Thus, to achieve preferred electrical characteristics, the first and second semiconductor devices are preferably formed in separate sub-well regions which are biased at different potentials, instead of being formed in the same sub-well region and being biased at the same potential. The present invention also includes methods of forming the preferred memory devices.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The terms "first conductivity type" and "second conductivity type" refer to opposite conductivity types and each embodiment disclosed herein includes its complementary embodiment as well.

Figure 3:
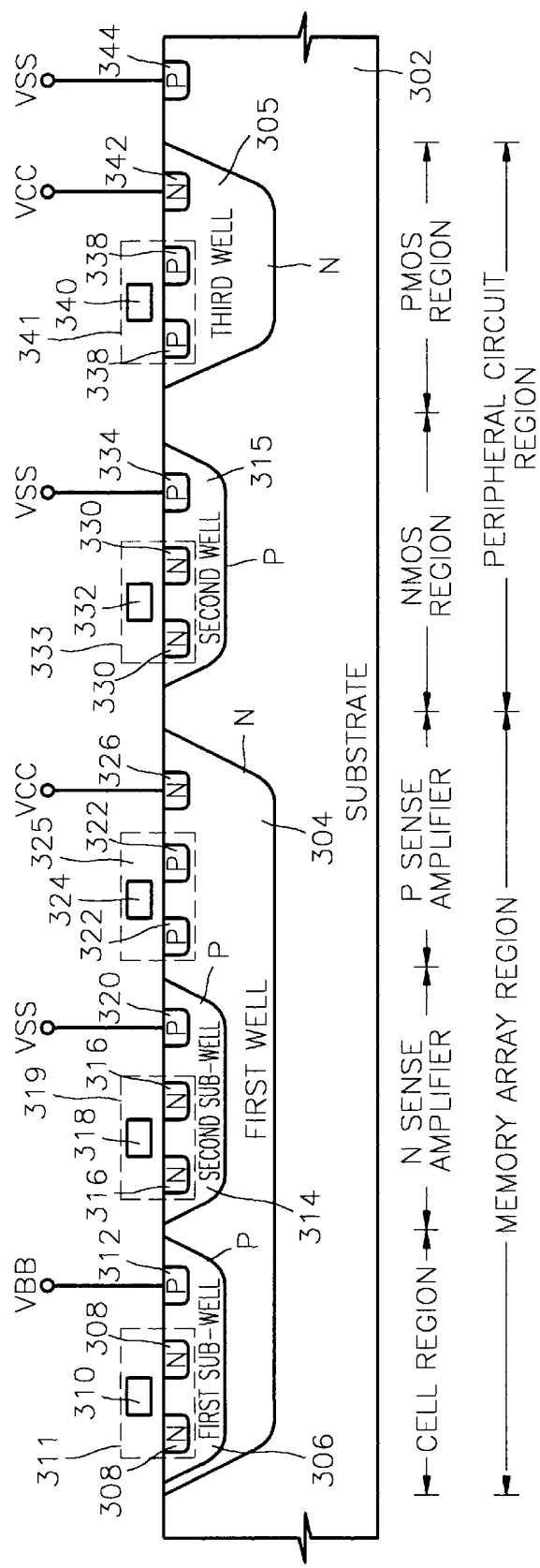
FIG. 3 is a cross-sectional view of an integrated circuit memory device according to an embodiment of the present invention.
Figure 4:
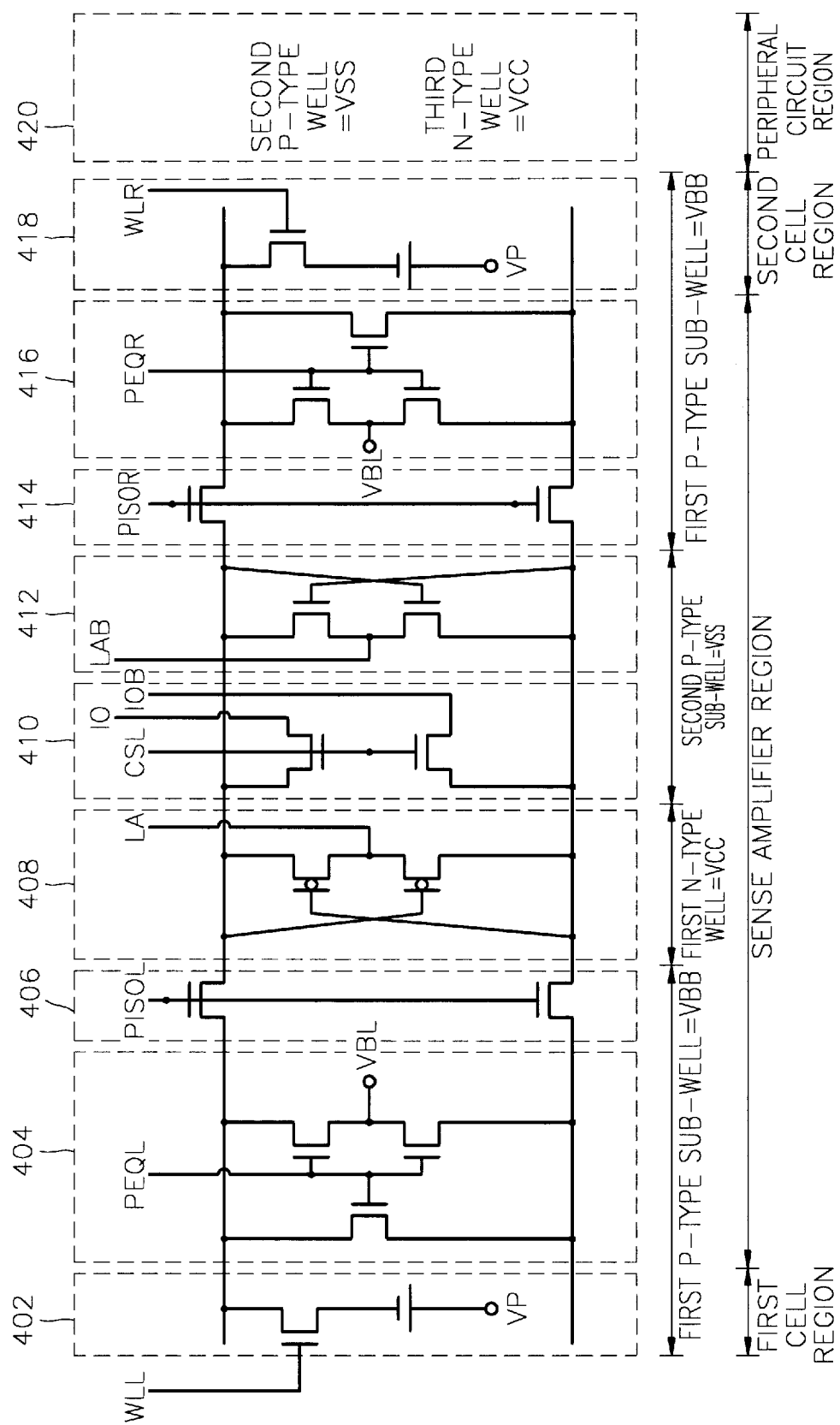
FIG. 4 is an electrical schematic of an integrated circuit memory device according to an embodiment of the present invention.

Referring now to FIGS. 3–4, integrated circuit memory devices according to an embodiment of the present invention will be described. The operating characteristics of integrated circuit memory devices which contain sense amplifiers are also more fully described in U.S. Pat. No. 5,701,268 to Lee et al., entitled "Sense Amplifier for Integrated Circuit Memory Devices Having Boosted Sense and Current Drive Capability and Methods of Operating Same", assigned to the present assignee, the disclosure of which is hereby incorporated herein by reference. In particular, FIG. 3 illustrates a substrate 302 of first conductivity type (e.g., P-type), a first well region 304 of second conductivity type (e.g., N-type) in the substrate 302 and first and second nonoverlapping sub-well regions 306 and 314 of first conductivity type in the first well region 304. A second well region 315 of first conductivity type and a third well region 305 of second conductivity type are also provided in the substrate 302. As illustrated, the substrate 302 is divided into a memory cell array region and a peripheral circuit region. The memory cell array region is also divided into a cell region, an N-type sense amplifier region and a P-type sense amplifier region. The peripheral circuit region may also be divided into an NMOS region and a PMOS region.

In addition to the first and second nonoverlapping sub-well regions 306 and 314, the first well region 304 includes P-type source and drain regions 322 of a PMOS field effect transistor 325 which contains an insulated gate electrode 324, and an N-type contact region 326 which is electrically connected to a power supply signal line Vcc. The first P-type sub-well region 306 also includes N-type source and drain regions 308 of an NMOS field effect transistor 311 which contains an insulated gate electrode 310. A P-type contact region 312 is also provided in the first sub-well region 306. This P-type contact region 312 is electrically connected to a back bias signal line Vbb so that the first P-type sub-well region 306 can be maintained at a back bias potential. The second P-type sub-well region 314 also includes N-type source and drain regions 316 of an NMOS field effect transistor 319 which contains an insulated gate electrode 318. A P-type contact region 320 is also provided in the second sub-well region 314. This P-type contact region 320 is electrically connected to a ground potential signal line Vss so that the second P-type sub-well region 314 can be maintained at a ground potential Vss.

The second P-type well region 315 in the NMOS region of the substrate 302 includes N-type source and drain regions 330 of an NMOS field effect transistor 333 which includes an insulated gate electrode 332, and a P-type contact region 334 which is electrically connected to a ground potential signal line Vss. In addition, the third N-type well region 305 in the PMOS region of the substrate 302 includes N-type source and drain regions 338 of a PMOS field effect transistor 341 which includes an insulated gate electrode 340, and an N-type contact region 342 which is electrically connected to a power supply signal line Vcc.

Figure 1:
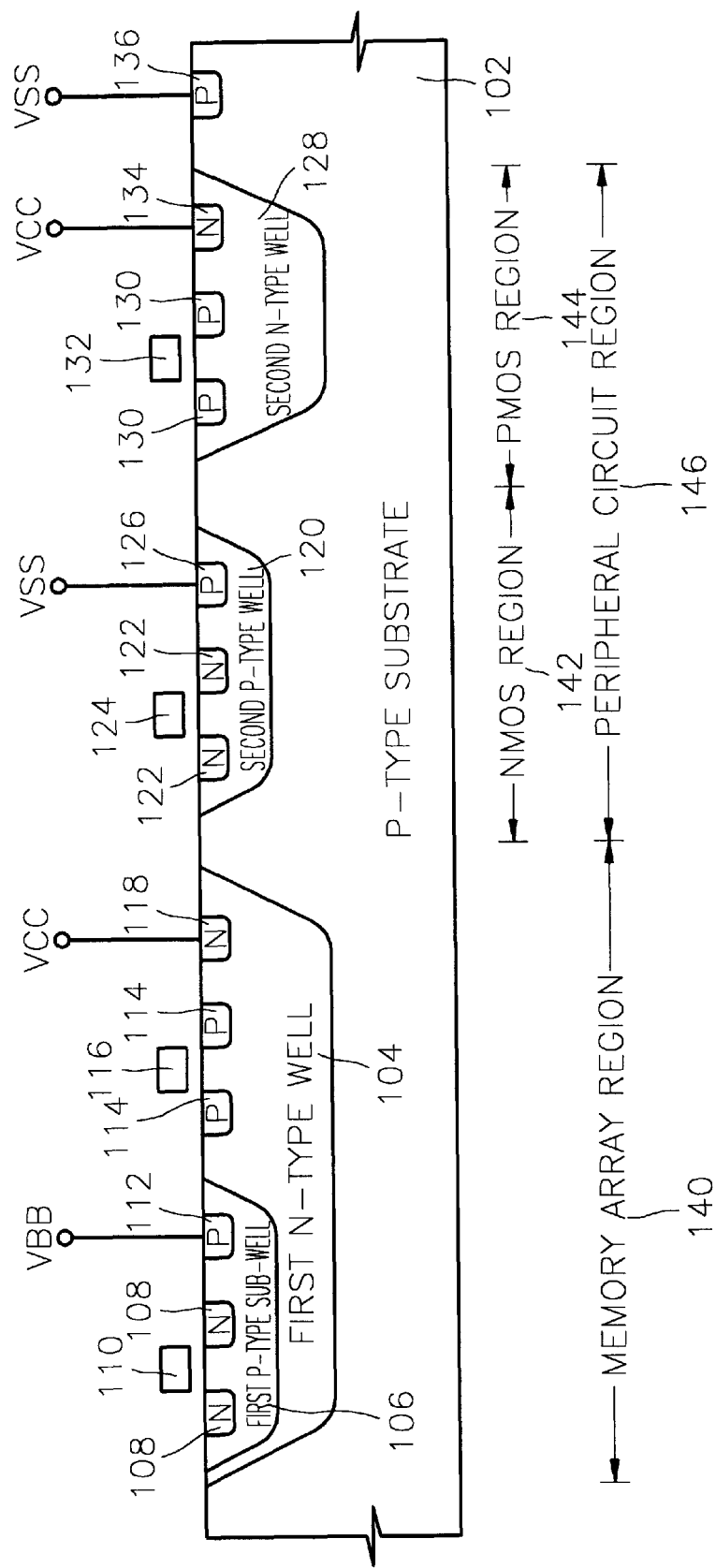
FIG. 1 is a cross-sectional view of an integrated circuit memory device according to the prior art.
Figure 2:
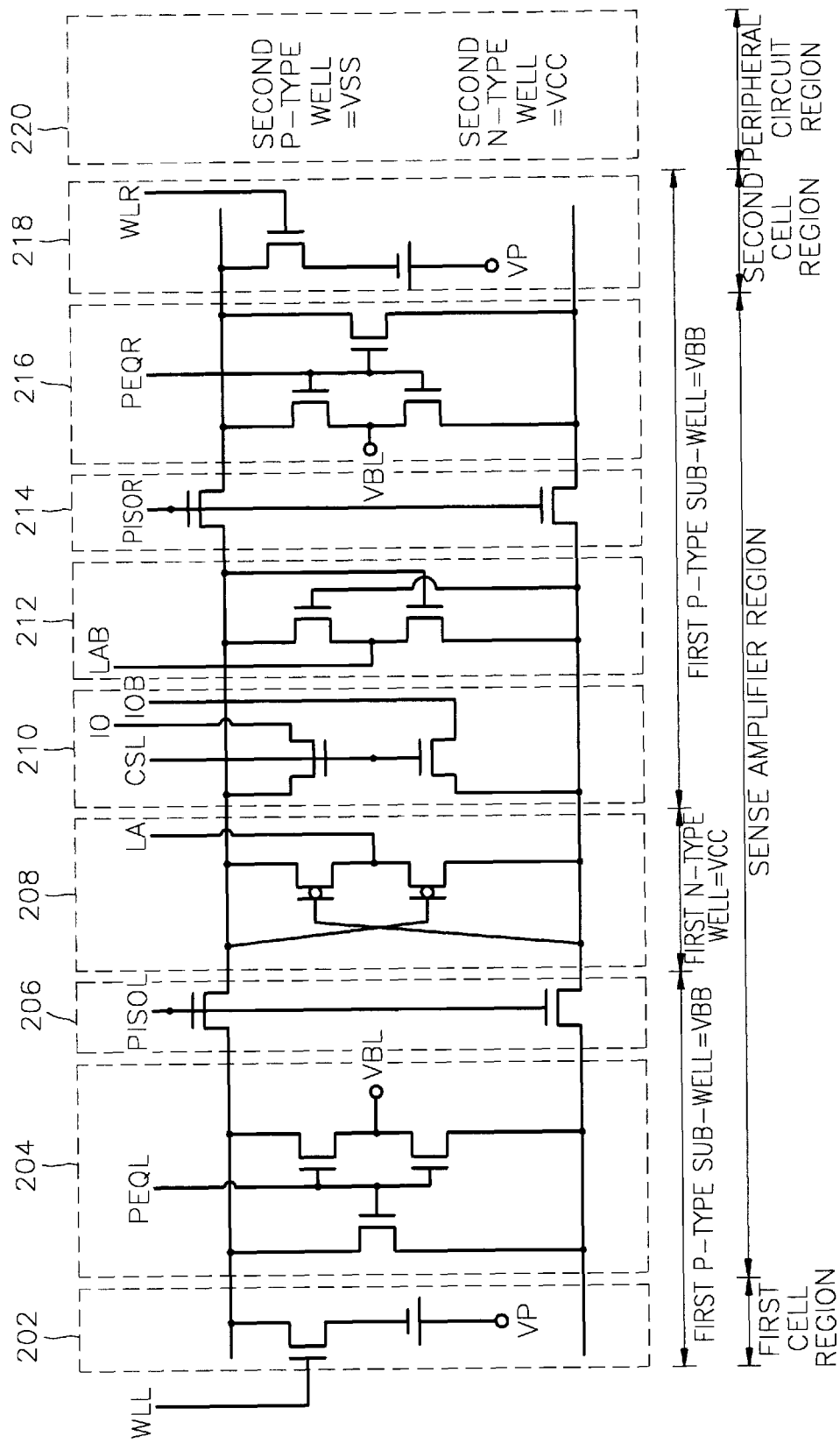
FIG. 2 is an electrical schematic of an integrated circuit memory device according to the prior art.

Referring now to FIG. 4, preferred electrical characteristics can be achieved by forming respective components of an integrated circuit memory device in the first N-type well region 304 and in the first and second nonoverlapping P-type sub-well regions 306 and 314. Peripheral circuits may also be formed in the second well region 315 and in the third well region 305. In particular, first and second memory cells 402 and 418, first and second equalization circuits 404 and 416, and first and second isolation gates 406 and 414 are preferably formed in the first P-type sub-well region 306 which is maintained at a back bias potential Vbb. In contrast, the column select circuit 410 and the N-type sense amplifier circuit 412 are formed in the second P-type sub-well region 314 which is maintained at a ground potential Vss. The P-type sense amplifier circuit 408 is also formed in the first N-type well region 304 which is maintained at a positive power supply potential Vcc. Thus, in contrast to the prior art of FIGS. 1–2, portions of the illustrated memory device of FIGS. 3–4 are formed in respective nonoverlapping sub-well regions which are independently biased at different potentials so that susceptibility to parasitics such as short-channel effects, latch-up and noise can be reduced.

Referring again to FIG. 3, the first and third N-type well regions 304 and 305 may be formed by selectively masking a portion of the face of the P-type substrate 302 and then implanting N-type dopants into exposed portions of the face at a predetermined dose level and a predetermined implant energy. An annealing step may then be performed to drive-in and diffuse the implanted N-type dopants to substantially define the N-type well regions. Next, another selective masking step may be performed to expose alternative portions of the face of the substrate. Then, P-type dopants may be implanted at a predetermined dose level and a predetermined implant energy, into the first N-type well region 304 and into the substrate 302. An annealing step may again be performed to drive-in and diffuse these implanted P-type dopants and substantially define the first and second P-type sub-well regions 306 and 314 and the second well region 315. Conventional processing steps may then be performed to complete the structure illustrated by FIG. 3.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a semiconductor substrate of first conductivity type;
   a first well region of second conductivity type in said semiconductor substrate and forming a first P-N rectifying junction therewith;
   a first sub-well region of first conductivity type in said first well region and forming a second P-N rectifying junction therewith;
   a second sub-well region of first conductivity type in said first well region and forming a third P-N rectifying junction therewith which does not intersect the second P-N rectifying junction;
   a first semiconductor device in said first sub-well region, said first semiconductor device selected from the group consisting of a memory cell access transistor, an equalization circuit and an isolation gate;
   a second semiconductor device in said second sub-well region, said second semiconductor device selected from the group consisting of a column select circuit and a sense amplifier;
   a first well contact region of second conductivity type in said first well region and forming a nonrectifying junction therewith;
   a first sub-well contact region of first conductivity type in said first sub-well region and forming a nonrectifying junction therewith;
   a second sub-well contact region of first conductivity type in said second sub-well region and forming a nonrectifying junction therewith;
   a first reference signal line electrically coupled to said first well contact region;
   a back-bias signal line electrically coupled to said first sub-well contact region; and
   a second reference signal line electrically coupled to said second sub-well contact region.

2. The memory device of claim 1, wherein the first conductivity type is P-type conductivity; wherein the second conductivity type is N-type conductivity; wherein said first reference signal line is electrically coupled to a positive power supply signal line; and wherein said second reference signal line is electrically coupled to a ground line or a negative power supply signal line.

3. The memory device of claim 1, further comprising:
   a second well region of first conductivity type in said semiconductor substrate and forming a nonrectifying junction therewith; and
   a third well region of second conductivity type in said semiconductor substrate and forming a fourth P-N rectifying junction therewith.

4. The memory device of claim 3, further comprising:
   a first peripheral circuit in said second well region; and
   a second peripheral circuit in said third well region.

5. An integrated circuit memory device, comprising:
   a semiconductor substrate of first conductivity type;
   a first well region of second conductivity type in said semiconductor substrate and forming a first P-N rectifying junction therewith;
   a first sub-well region of first conductivity type in said first well region and forming a second P-N rectifying junction therewith;
   a second sub-well region of first conductivity type in said first well region and forming a third P-N rectifying junction therewith which does not intersect the second P-N rectifying junction;
   a second conductivity type region of a first semiconductor device in said first sub-well region, said first semiconductor device selected from the group consisting of a memory cell access transistor, an equalization circuit and an isolation gate;
   a second conductivity type region of a second semiconductor device in said second sub-well region, said second semiconductor device selected from the group consisting of a column select circuit and a sense amplifier;
   a first well contact region of second conductivity type in said first well region and forming a nonrectifying junction therewith;
   a first sub-well contact region of first conductivity type in said first sub-well region and forming a nonrectifying junction therewith;
   a second sub-well contact region of first conductivity type in said second sub-well region and forming a nonrectifying junction therewith;
   a first reference signal line electrically coupled to said first well contact region;
   a back-bias signal line electrically coupled to said first sub-well contact region; and
   a second reference signal line electrically coupled to said second sub-well contact region.

6. The memory device of claim 5, wherein the first conductivity type is P-type conductivity; wherein the second conductivity type is N-type conductivity; wherein said first reference signal line is electrically coupled to a positive power supply signal line; and wherein said second reference signal line is electrically coupled to a ground line or a negative power supply signal line.

7. The memory device of claim 5, further comprising:
   a second well region of first conductivity type in said semiconductor substrate and forming a nonrectifying junction therewith; and
   a third well region of second conductivity type in said semiconductor substrate and forming a fourth P-N rectifying junction therewith.

8. The memory device of claim 7, further comprising:
   a first peripheral circuit in said second well region; and
   a second peripheral circuit in said third well region.

* * * * *